United States Patent [19]
Blackwell

[11] Patent Number: 5,320,706
[45] Date of Patent: Jun. 14, 1994

[54] REMOVING SLURRY RESIDUE FROM SEMICONDUCTOR WAFER PLANARIZATION

[75] Inventor: Robert E. Blackwell, Denison, Tex.

[73] Assignee: Texas Instruments Incorporated, Dallas, Tex.

[21] Appl. No.: 777,838

[22] Filed: Oct. 15, 1991

[51] Int. Cl.$^5$ .................................. H01L 21/304
[52] U.S. Cl. .................... 156/636; 51/281 R; 51/283 R; 134/33; 134/902; 437/228
[58] Field of Search ......... 156/636; 51/283 R, 281 R; 437/228; 134/33, 902

[56] References Cited

U.S. PATENT DOCUMENTS

| | | | |
|---|---|---|---|
| 3,841,031 | 10/1974 | Walsh | 51/283 R |
| 3,979,239 | 9/1976 | Walsh | 156/636 |
| 4,050,954 | 9/1977 | Basi | 134/2 |
| 4,116,714 | 9/1978 | Basi | 134/28 |
| 4,129,457 | 12/1978 | Basi | 134/2 |
| 4,193,226 | 3/1980 | Gill, Jr. et al. | 51/124 R |
| 4,680,893 | 7/1987 | Cronkhite et al. | 51/283 R |
| 4,910,155 | 3/1990 | Cote et al. | 156/637 |

FOREIGN PATENT DOCUMENTS 0199288 10/1986 European Pat. Off. .

OTHER PUBLICATIONS

*Rodel Surfacetech Review*, vol. 1, Issue 2, Mar. 1987, pp. 1-4.

*Primary Examiner*—Brian E. Hearn
*Assistant Examiner*—Laura M. Holtzman
*Attorney, Agent, or Firm*—Wade James Brady; Richard L. Donaldson

[57] ABSTRACT

Polish slurry particles remaining on a semiconductor wafer after mechanical planarization are removed from the semiconductor wafer by polishing the wafer with a polishing pad while a mixture of deionized water and a surfactant is applied to the wafer and the pad.

10 Claims, 2 Drawing Sheets

REMOVING SLURRY RESIDUE FROM SEMICONDUCTOR WAFER PLANARIZATION

FIELD OF THE INVENTION

This invention relates generally to semiconductor wafers, and more particularly to a method of removing polishing slurry after mechanical planarization.

BACKGROUND OF THE INVENTION

Resist etch back has been used to planarize bird's head topography on the surface of semiconductor wafers. Plasma etch has also been used. These processes are time consuming and expensive Mechanical planarization requires the introduction of polishing slurry onto the surface of a semiconductor wafer. The silicon dioxide particles are the aggregate in the polishing slurry and must be removed prior to any subsequent processing. Near total removal of residual polishing slurry is necessary to prevent problems in successive processing steps.

Depending upon prior processing steps on the semiconductor wafer, some types of clean up procedures are detrimental to the wafer. Slurry removal may be accomplished by acid etch, but the acid not only attacks the slurry aggregate but also attacks dielectric films on the wafer surface. In this instance, the prior wafer processing steps are damaged or even destroyed. Removal of the residual polishing slurry is necessary in a way that does not damage the wafer or dielectric films thereon.

BRIEF SUMMARY OF THE INVENTION

The invention is a process for polishing slurry removal after mechanical planarization. This is accomplished by the application of a mixture of a mild surfactant, for example Wako NCW-601-A, and deionized water. The surfactant/deionized water is applied to the surface of the semiconductor wafer with a soft pad to provide a mild scrubbing action to remove the slurry aggregate. The cleaning mixture may be applied at the last polishing station by substituting the supply of slurry with the cleaning mixture to the polishing station. Data collected on wafer samples after mechanical planarization and without the addition of the cleaning mixture showed an excess of 3000 particles of slurry aggregate. Samples that were subjected to the cleaning mixture at the final polishing station yielded particle levels below 100 particles.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

The invention is to a method of mechanical planarization of semiconductor wafers and the sequent clean-up of the wafer to remove polishing slurry particles remaining on the wafer after polishing is completed. The semiconductor is subjected to a polishing action by applying a abrasive polishing slurry to a polishing pad and polishing the surface with the pad containing the slurry.

After completion of polishing the semiconductor surface, the semiconductor surface is rinsed to remove the slurry. To completely remove or as near as possible the remaining slurry particles, a mixture of a surfactant and deionized water is applied to a polishing pad, and the pad is applied to the semiconductor wafer surface. The polishing pad and surfactant/deionized water mixture are applied to the surface of the semiconductor surface for a period of, for example, 30 seconds. The step of polishing with the surfactant and deionized water mixture removes a much greater percentage of the particles of slurry than in prior art rinsing.

Figure 1:
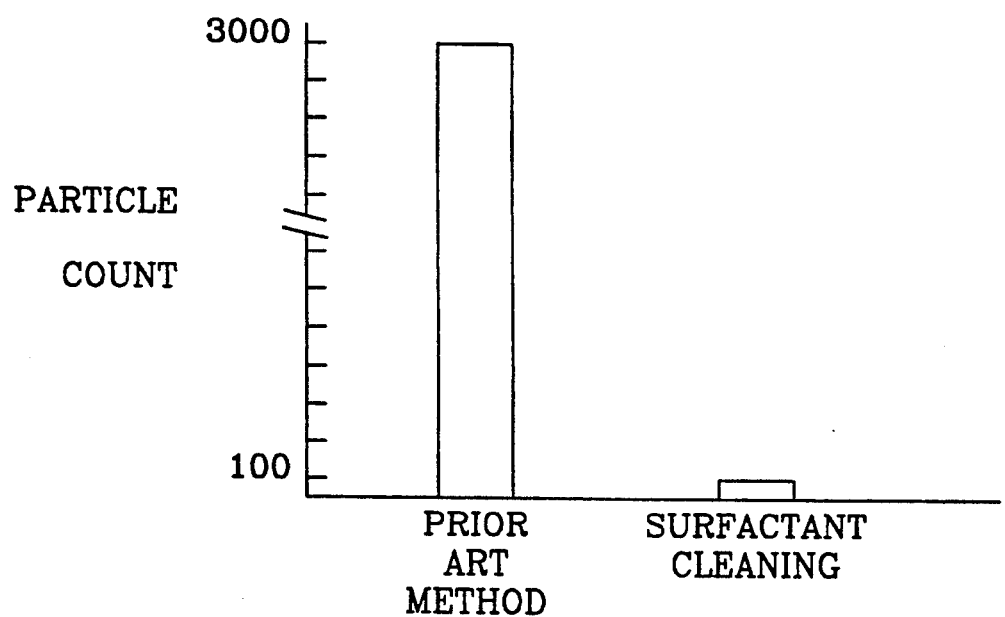
FIG. 1 is a chart showing the reduction in particles using the invention.

FIG. 1 illustrates that, in one test, approximately 3000 particles remained after rinsing, and that only about 100 particles remained after rinsing with the deionized water/surfactant solution.

In the example, particle count data was collected with a laser particle counter, capable of detecting particles in the 0.5 to 50 micron range on a 125 mm wafer. Data was collected on the samples after mechanical planarization without the addition of surfactant during the final polish followed by standard spin rinse.

Figure 2:
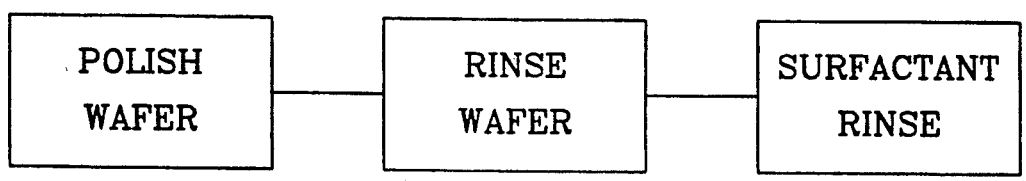
FIG. 2, is a block diagram showing the polishing and clean steps.

FIG. 2 illustrates the basic steps in polishing and cleaning the polished semiconductor wafer. The wafer is subject to mechanical planarization by polishing the wafer with a slurry of, for example, "CAB-O-SPERSE", a register trademark of Cabot Corporation, and comprised of approximately 30% Silicon dioxide (amorphous), 69% De-Ionized water, and at least 1% of Potassium Hydroxide in a 1:1 dilution with deionized water. The slurry solution was dispersed with a flow of 250 ml per minute onto the polishing pad. The platen on which the polishing pad was mounted was rotated at 15 rpm and the wafer carrier was rotated at 15 rpm and also was oscillated at a speed of 2 mm per second in a range of 5 mm. Polish time was about one minute, at a temperature of approximately 110° F., and a downward force was applied to the wafer with the pad was about 7 psi.

The wafer was rinsed after polishing.

In one example of the invention, "WAKO-601-A", a product of Wako Pure Chemical Industries, Ltd, which is comprised of approximately 30% polyoxyalkylene alkylphenyl ether and 70% water, surfactant was diluted 100:1 with deionized water. The mixture flow onto the polishing pads was approximately 300 ml/min. The polishing platen speed was approximately 80 rpm and the wafer carrier was rotated at 60 rpm and also oscillated at a speed of 2 mm/sec over a range of 20 mm. Polishing time was approximately 30 seconds, and the polishing pad was moved against the semiconductor wafer with a down force of approximately 6 psi while the surfactant/water mixture was applied to the polish pad and wafer.

Figure 3:
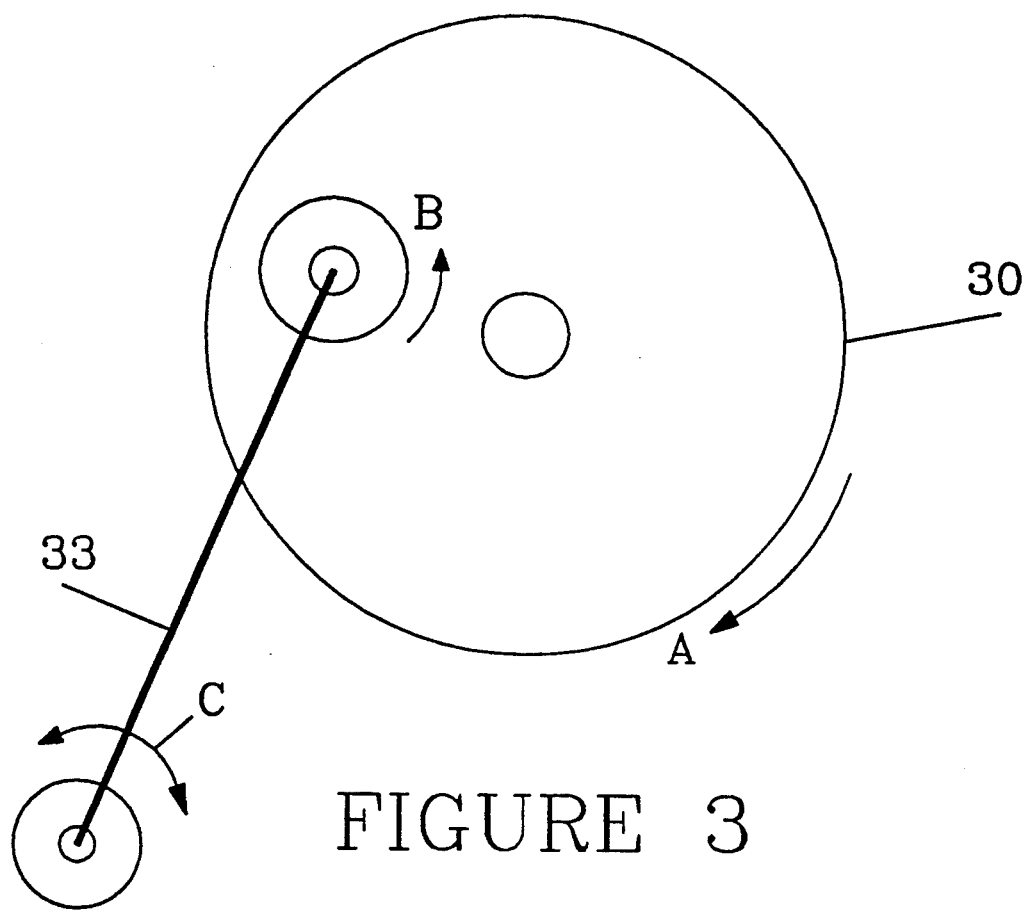
FIG. 3 is a top view of the polishing station.
Figure 4:
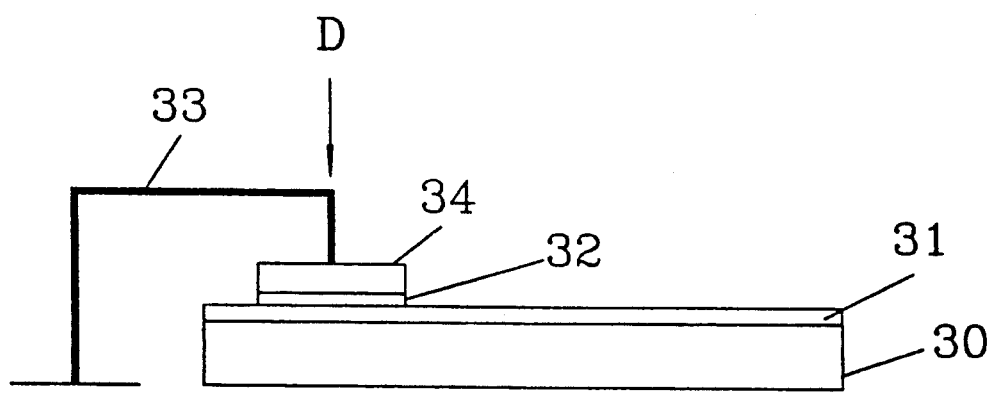
FIG. 4 is a side view of the polishing station.

FIGS. 3 and 4 are top and side views, respectively, of a simple illustration of the polishing station. Platen 30 is rotated as indicated by arrow A. Wafer 32 is held against polish pad 31 by plate 34. Plate 34 and carrier assembly 33 hold wafer 32 against pad 31. Carrier assembly 33 oscillates as shown in FIG. 3, arrow C, and the wafer is rotated as illustrated by arrow B. A downward force is applied to wafer 32 as illustrated by arrow D.

What is claimed:

1. A method for removing slurry polish particle residue after mechanical planarization of a semiconductor wafer with a slurry comprising the steps of:

rotating the wafer, on an oscillating carrier assembly, against a rotating polishing pad;

applying a rinse to remove the slurry from the wafer;

to completely remove the remaining slurry particles; apply a rinse of deionized water containing a surfactant to the polishing pad; and polishing the planarized surface of the semiconductor wafer with the pad and deionized water/surfactant mixture rinse to remove remaining slurry particles.

2. The method according to claim 1, applying the deionized water/surfactant mixture at a rate between 100 and 400 ml per minute.

3. The method according to claim 1, including the step of rotating the polishing pad on a platen.

4. The method according to claim 3, wherein the platen is rotated at approximately 80 rpm.

5. The method according to claim 1, including the step of:

holding the polishing pad against the semiconductor wafer during polishing with a downward force of approximately 6 psi.

6. A method for removing slurry polish particles residue after mechanical planarization of a semiconductor wafer with a slurry comprising the steps of:

rotating the wafer, on an oscillating carrier assembly, against a rotating polishing pad;

applying a rinse to remove the slurry from the wafer;

to completely remove the remaining slurry particles apply a rinse of deionized water containing a surfactant, including a mixture of polyoxyalkylene alkylphenyl ether and water, to a polishing pad; and polishing the planarized surface of the semiconductor wafer by applying a downward force on the polishing pad as the deionized water/surfactant mixture is applied to the semiconductor wafer, and polishing pad to remove remaining slurry particles.

7. The method according to claim 6, applying the deionized water/surfactant mixture at a rate between 100 and 400 ml per minute.

8. The method according to claim 6, including the step of rotating the carrier assembly on a platen.

9. The method according to claim 8, wherein the platen is rotated at approximately 80 rpm.

10. The method according to claim 6, including the step of:

holding the polishing pad against the semiconductor wafer during polishing with a downward force of approximately 6 psi.

* * * * *